United States Patent
Huang et al.

(10) Patent No.: US 9,048,148 B2
(45) Date of Patent: Jun. 2, 2015

(54) METHOD OF MANUFACTURING TFT ARRAY USING MULTI-TONE MASK

(75) Inventors: Hua Huang, Shenzhen (CN); Pei Jia, Shenzhen (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 77 days.

(21) Appl. No.: 13/574,248

(22) PCT Filed: May 9, 2012

(86) PCT No.: PCT/CN2012/075232
§ 371 (c)(1),
(2), (4) Date: Jul. 20, 2012

(87) PCT Pub. No.: WO2013/159396
PCT Pub. Date: Oct. 31, 2013

(65) Prior Publication Data
US 2013/0285063 A1  Oct. 31, 2013

(30) Foreign Application Priority Data
Apr. 28, 2012 (CN) .......................... 2012 1 0132092

(51) Int. Cl.
*H01L 27/14* (2006.01)
*H01L 27/12* (2006.01)

(52) U.S. Cl.
CPC .................................. *H01L 27/1288* (2013.01)

(58) Field of Classification Search
USPC ............................... 257/72, E33.066; 438/22
See application file for complete search history.

(56) References Cited

U.S. PATENT DOCUMENTS

| | | | |
|---|---|---|---|
| 2007/0002249 A1* | 1/2007 | Yoo et al. | 349/141 |
| 2007/0170432 A1* | 7/2007 | Lee et al. | 257/66 |
| 2009/0111198 A1* | 4/2009 | Fujikawa et al. | 438/22 |
| 2011/0031498 A1* | 2/2011 | Kimura et al. | 257/59 |
| 2011/0254006 A1* | 10/2011 | Kuriyagawa et al. | 257/59 |

* cited by examiner

*Primary Examiner* — Matthew Gordon

(57) ABSTRACT

The present invention discloses a thin-film transistor (TFT) array substrate and a manufacturing method thereof. Depositing a transparent conductive layer and a first metal layer on a substrate, which is patterned by a multi-tone mask (MTM) to form a gate, a common electrode and a reflecting layer; depositing a gate insulation layer, which is patterned by a first mask to remain the gate insulation layer on the gate; depositing a semiconductor layer, which is patterned by a second mask to remain the semiconductor layer on the gate; and depositing a second metal layer, which is patterned by a third mask to form a source and a drain.

15 Claims, 3 Drawing Sheets

METHOD OF MANUFACTURING TFT ARRAY USING MULTI-TONE MASK

FIELD OF THE INVENTION

The present invention relates to the field of liquid crystal manufacturing technique, and more particularly to a thin-film transistor (TFT) array substrate and a manufacturing method thereof.

BACKGROUND OF THE INVENTION

With the constant extension and popularization of the liquid crystal display (LCD), the display performance of LCD becomes demanding. For example, a transflective LCD still can provide a clear display performance under the direct sunlight outdoors, so that it is widely applied to the field of LCD.

During the manufacturing process of the TFT array substrate of the transflective LCD, it requires a plurality of masks to execute photo-lithography processes. Especially after forming the transparent pixel electrodes, it needs an additional mask to execute a photo-lithography process for forming the reflecting layer; however, the more masks, the more costs during the manufacturing process of the TFT, and it also increases the manufacturing time and complexity.

Therefore, among the traditional techniques, due to the specifically additional mask to form the reflecting layer, it complicates the process of the TFT array substrate of the transflective LCD and boosts the manufacturing difficulty and costs, so that the production difficulty of the LCD is increased.

SUMMARY OF THE INVENTION

One of the objectives of the present invention is to provide a manufacturing method of a TFT array substrate to solve the traditional technique which specifically adds a mask to form a reflecting layer and thus complicates the process of the TFT array substrate of the transflective LCD and boosts the manufacturing difficulty and costs to increase the production difficulty of the LCD.

To solve the problems mentioned above, the present invention provides a method for manufacturing a TFT array substrate, wherein the method comprises the following steps of:

providing a substrate;

depositing a transparent conductive layer and a first metal layer in turn on the substrate, and patterning the transparent conductive layer and the first metal layer by a multi-tone mask (MTM) to form a gate, a common electrode and a reflecting layer, wherein the gate comprises the transparent conductive layer and the first metal layer; the common electrode is formed by the transparent conductive layer; the reflecting layer is formed by the first metal layer; the MTM is a gray tone mask (GTM);

depositing a gate insulation layer on the substrate, and patterning the gate insulation layer by a first mask to remain the gate insulation layer on the gate;

depositing a semiconductor layer on the substrate, and patterning the semiconductor layer by a second mask to remain the semiconductor layer on the gate; and depositing a second metal layer on the substrate, wherein the second metal layer is formed by stacking a second molybdenum metal layer, a second aluminum metal layer and a third molybdenum metal layer in turn; and patterning the second metal layer by a third mask to form a source and a drain including the second metal layer.

In one embodiment of the present invention, in the step of patterning the gate insulation layer by the first mask, the gate insulation layer on the common electrode is remained.

In one embodiment of the present invention, after forming the source and the drain, the method further comprises the following step of:

depositing a flattening layer on the gate insulation layer remained on the common electrode and the source, drain and semiconductor layer constructing the TFT, wherein the flattening layer is formed by a transparent insulation material.

In one embodiment of the present invention, in the step of patterning the gate insulation layer by the first mask, the gate insulation layer on the common electrode is removed by etching.

In one embodiment of the present invention, after forming the source and the drain, the method further comprises the following step of:

depositing a flattening layer on the common electrode, the reflecting layer on the common electrode, and the source, drain, and semiconductor layer constructing the TFT, wherein the flattening layer is formed by a transparent insulation material.

In one embodiment of the present invention, the transparent conductive layer and the first metal layer are formed by sputter deposition.

In one embodiment of the present invention, the first metal layer is formed by stacking a first aluminum metal layer and a first molybdenum metal layer in turn.

In one embodiment of the present invention, in the step of patterning the transparent conductive layer and the first metal layer by the MTM to form the gate, the common electrode and the reflecting layer, the first metal layer is wet-etched by a mixture of nitric acid, phosphoric acid and acetic acid; the transparent conductive layer is wet-etched by oxalic acid.

Another objective of the present invention is to provide a manufacturing method of TFT array substrate to solve the traditional technique which specifically adds a mask to form a reflecting layer and thus complicates the process of the TFT array substrate of the transflective LCD and boosts the manufacturing difficulty and costs to increase the production difficulty of the LCD.

To solve the problems mentioned above, the present invention provides a method for manufacturing a TFT array substrate, wherein the method comprises the following steps of:

providing a substrate;

depositing a transparent conductive layer and a first metal layer in turn on the substrate, and patterning the transparent conductive layer and the first metal layer by a MTM to form a gate, a common electrode and a reflecting layer, wherein the gate comprises the transparent conductive layer and the first metal layer; the common electrode is formed by the transparent conductive layer; the reflecting layer is formed by the first metal layer;

depositing a gate insulation layer on the substrate, and patterning the gate insulation layer by a first mask to remain the gate insulation layer on the gate;

depositing a semiconductor layer, and patterning the semiconductor layer by a second mask to remain the semiconductor layer on the gate; and depositing a second metal layer and patterning the second metal layer by a third mask to form a source and a drain including the second metal layer.

In one embodiment of the present invention, in the step of patterning the gate insulation layer by the first mask, the gate insulation layer on the common electrode is remained.

In one embodiment of the present invention, after forming the source and the drain, the method further comprises the following step of:

depositing a flattening layer on the gate insulation layer remained on the common electrode and the source, drain, and semiconductor layer constructing the TFT, wherein the flattening layer is formed by a transparent insulation material.

In one embodiment of the present invention, in the step of patterning the gate insulation layer by the first mask, the gate insulation layer on the common electrode is removed by etching.

In one embodiment of the present invention, after forming the source and the drain, the method further comprises the following step of:

depositing a flattening layer on the common electrode, the reflecting layer on the common electrode, and the source, drain, and semiconductor layer constructing the TFT, wherein the flattening layer is formed by a transparent insulation material.

In one embodiment of the present invention, the MTM is a GTM, a stacked layer mask (SLM) or a half tone mask (HTM).

In one embodiment of the present invention, the transparent conductive layer and the first metal layer are formed by sputter deposition.

In one embodiment of the present invention, the first metal layer is formed by stacking a first aluminum metal layer and a first molybdenum metal layer in turn; the second metal layer is formed by stacking a second molybdenum metal layer, a second aluminum metal layer and a third molybdenum metal layer in turn.

In one embodiment of the present invention, in the step of patterning the transparent conductive layer and the first metal layer by the MTM to form the gate, the common electrode and the reflecting layer, the first metal layer is wet-etched by a mixture of nitric acid, phosphoric acid and acetic acid; the transparent conductive layer is wet-etched by oxalic acid.

Another objective of the present invention is to provide a TFT array substrate to solve the traditional technique which specifically adds a mask to form a reflecting layer and thus complicates the process of the TFT array substrate of the transflective LCD and boosts the manufacturing difficulty and costs to increase the production difficulty of the LCD.

To solve the problems mentioned above, the present invention provides a TFT array substrate, wherein the method comprises:

a substrate;

a plurality of TFTs arranged on the substrate, wherein each of the TFTs comprises a gate, a gate insulation layer, a semiconductor layer, a source and a drain; the gate, the gate insulation layer, the semiconductor layer, the source and the drain are formed in turn on the substrate; the gate is formed by stacking a transparent conductive layer and a first metal layer; and the source and the drain are formed by a second metal layer;

a common electrode arranged on the substrate and formed by the transparent conductive layer; and a reflecting layer arranged on the common electrode and formed by the first metal layer.

Comparing to the traditional technique, after depositing the transparent conductive layer and the first metal layer in turn on the substrate, the present invention executes a MTM process, which can simultaneously form the reflecting layer when forming the gate and the common electrode; executes the first mask process after depositing the gate insulation layer on the substrate, and then executes the second mask process after depositing the semiconductor layer; subsequently executes the third mask process after depositing the second metal layer to form the TFT array substrate of the transflective LCD. Apparently, the formation of the TFT array substrate of the transflective LCD, through four masks in the present invention, simplifies the process, reduces the manufacturing difficulty and costs, and increases the LCD yield.

For the present invention described above will be more apparent, the following specific preferable embodiment with the companying drawings will be elaborated as follows:

DETAILED DESCRIPTION OF THE PREFERRED EMBODIMENTS

The structure and the technical means adopted by the present invention to achieve the above and other objects can be best understood by referring to the following detailed description of the preferred embodiments and the accompanying drawings. Also, directional terms described by the present invention, such as upper, lower, front, back, left, right, inner, outer, side, longitudinal/vertical, transverse/horizontal, and etc., are only directions by referring to the accompanying drawings. Therefore, the used directional terms are used to describe and understand the present invention, but the present invention is not limited thereto.

In the figures, the similar structural units are designated by the same reference numbers.

Figure 1:
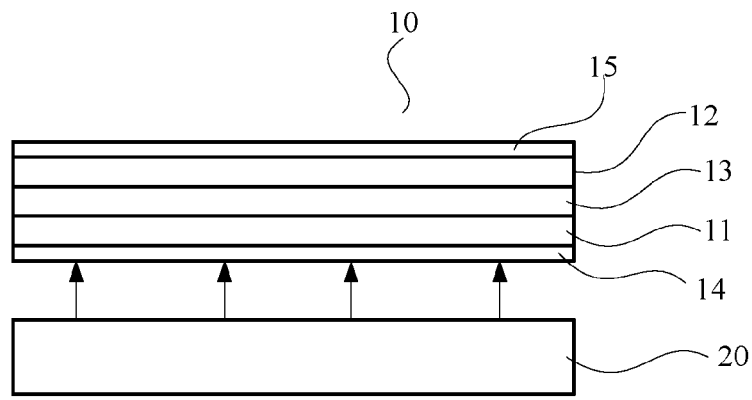
FIG. 1 is a sectional schematic view of a display panel and a backlight module of a preferred embodiment in the present invention.

Please refer to FIG. 1, a sectional schematic view of a display panel and a backlight module of a preferred embodiment in the present invention is illustrated. The method for manufacturing the TFT array substrate of this embodiment can be applied to the manufacturing process of a display panel 10 (for example, a LCD panel) to make a protective layer of a transistor. When applying the display panel 10 of the embodiment to manufacture a LCD device, the display panel 10 can be arranged on a backlight module 20 so as to form the LCD. The display panel 10 can comprise a first substrate 11, a second substrate 12, a liquid crystal layer 13, a first polaroid 14 and a second polaroid 15. The material of the first substrate 11 and the second substrate 12 can be a glass substrate or a flexible plastic substrate. In this embodiment, the first substrate 11 can be for example a TFT array substrate, and the second substrate 12 can be for example a color filter (CF) substrate. It is noteworthy that in some embodiments, the CF and TFT matrix can be arranged on the same substrate as well.

As shown in FIG. 1, a liquid crystal layer 13 is formed between the first substrate 11 and the second substrate 12. The first polaroid 14 is arranged on a side of the first substrate 11 and opposite to the liquid crystal layer 13 (i.e. the incident side of the first substrate 11); the second polaroid 15 is arranged on a side of the second substrate 12 and opposite to the liquid crystal layer 13 (i.e. the emission side of the second substrate 12).

FIG. 2A-2F are flow schematic diagrams of the preferred embodiment of the method for manufacturing the TFT array substrate in the present invention.

Figure 2A:
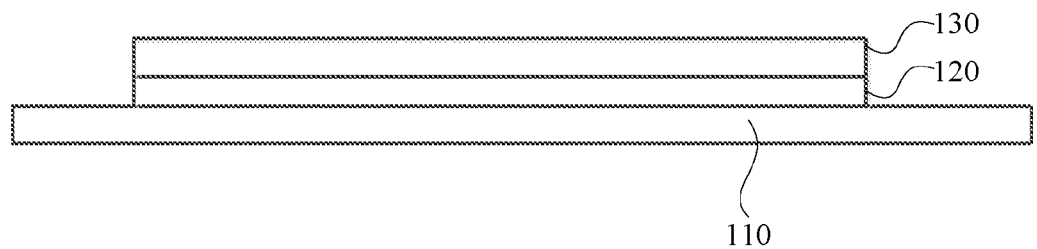
FIG. 2A-2F are flow schematic diagrams of the preferred embodiment of the method for manufacturing the TFT array substrate in the present invention.

Please refer to FIG. 2A, a substrate 110 is provided, and a transparent conductive layer 120 and a first metal layer 130 are deposited in turn on the substrate 110.

Preferably, the transparent conductive layer 120 is formed by a transparent conductive metal such as indium tin oxide (ITO), tin oxide (TO), indium zinc oxide (IZO) or indium tin zinc oxide (ITZO).

Preferably, the first metal layer 130 is formed by stacking a first aluminum metal layer and a first molybdenum metal layer in turn. Surely, it can be other materials, such as silver (Ag), copper (Cu), chromium (Cr), tungsten (W), tantalum (Ta), titanium (Ti), nitride metal or alloy combined by any above-mentioned metal, or it can also be a multi-layer structure with a heat resistant metallic film and a low resistivity film.

Figure 2B:
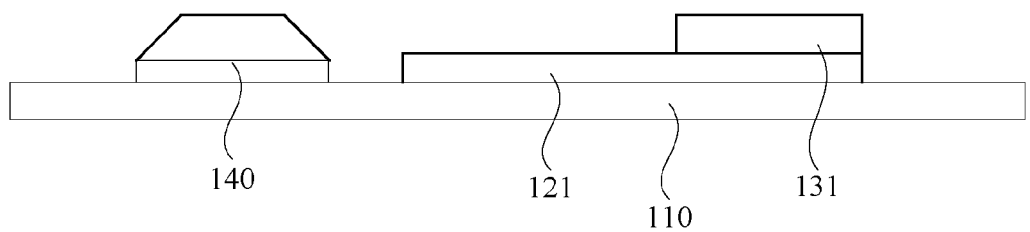

Please refer to FIG. 2B, the transparent conductive layer 120 and the first metal layer 130 as shown in FIG. 2A are patterned by a MTM to form a gate 140, a common electrode 121 and a reflecting layer 131. The gate 140 comprises the transparent conductive layer 120 and the first metal layer 130; the common electrode 121 is formed by the transparent conductive layer 120 on the substrate 110; and the reflecting layer 131 is formed by the first metal layer 130 on the common electrode 121.

In the specific embodiment, it is preferable to form the transparent conductive layer 120 and the first metal layer 130 by sputter deposition, and then to execute the photo-lithography and etching processes by the MTM to form the gate 140 on the transparent conductive layer 120 and the first metal layer 130. The common electrode 121 is formed by the transparent conductive layer 120 on the substrate 110, and the reflecting layer 131 is simultaneously formed by the first metal layer 130 on the common electrode 121.

In the specific embodiment, the MTM is a multi-tone photomask, which can be for example a GTM, a SLM or a HTM. The MTM can comprise an exposure zone, a partial exposure zone and an non-exposure zone so as to form the gate 140 by the transparent conductive layer 120 and the first metal layer 130, so that the common electrode 121 is formed by the transparent conductive layer 120 on the substrate 110 and the reflecting layer 131 is simultaneously formed by the first metal layer 130 on the common electrode 121.

In the step of patterning the transparent conductive layer 120 and the first metal layer 130 by the MTM to form the gate 140, the common electrode 121 and the reflecting layer 131, it is preferable to wet-etch the first metal layer 130 by a mixture of nitric acid, phosphoric acid and acetic acid, and it is preferable to wet-etch the transparent conductive layer 120 by oxalic acid so as to form the structure as shown in FIG. 2B. Surely, the transparent conductive layer 120 and the first metal layer 130 can be wet-etched by other methods, but the descriptions thereof are omitted herein.

Figure 2C:
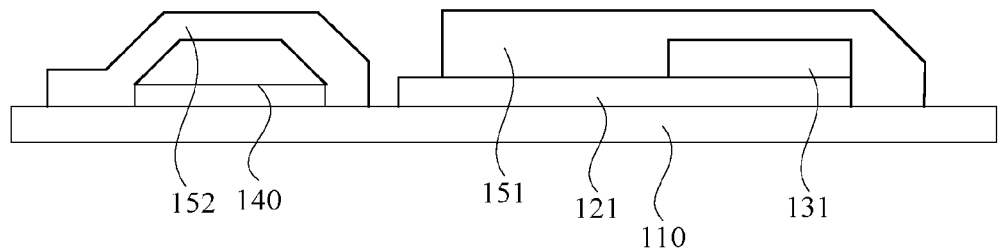

Please refer to FIG. 2C, a gate insulation layer is deposited on the substrate 110, and the gate insulation layer is patterned by a second mask to remain a gate insulation layer 151 on the common electrode 121 and selectively remain a gate insulation layer 152 on the gate.

In the embodiment, it is preferable to deposit the gate insulation layer by chemical vapor deposition (CVD), for example, plasma enhanced chemical vapor deposition (PECVD). Surely, the gate insulation can be deposited by other methods, but the descriptions thereof are omitted herein. The material of the gate insulation layer can be for example silicon nitride (SiNx) or silicon oxide (SiOx).

Figure 2D:
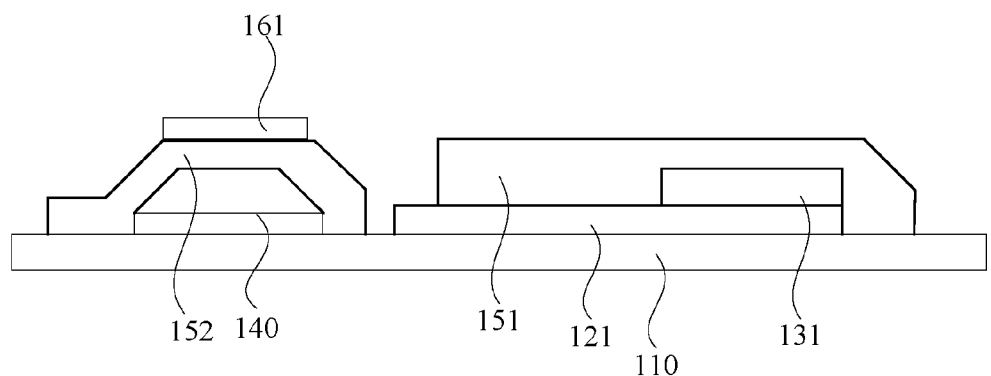

Please refer to FIG. 2D, a semiconductor layer is deposited on the substrate 110 and the semiconductor layer is patterned by a third mask to remain the semiconductor layer 161 on the gate 140 so as to form the structure as shown in FIG. 2D.

The present invention is preferable to deposit the semiconductor layer by CVD such as PECVD. Surely, the semiconductor can be deposited by other methods, but the descriptions thereof are omitted herein. Preferably, the material of the semiconductor layer is poly-silicon. In this embodiment, an amorphous silicon (a-Si) layer is first deposited on the semiconductor layer, and then the rapid thermal annealing (RTA) step is executed to the a-Si so as to be recrystallized as a poly-silicon layer.

Figure 2E:
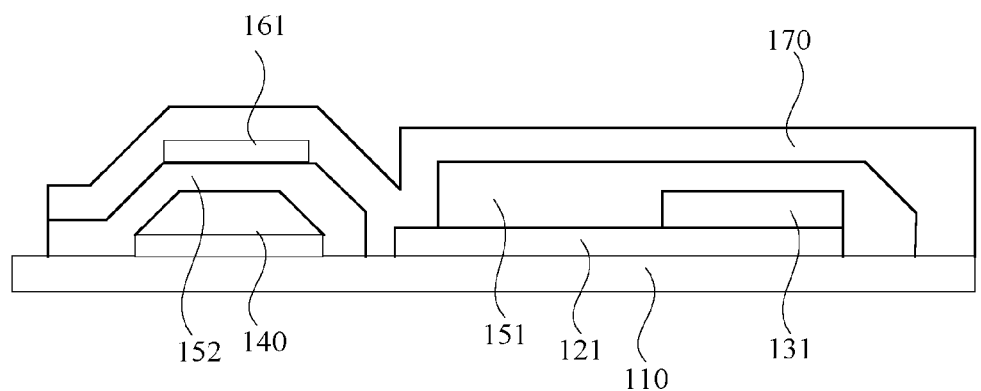

Please refer to FIG. 2E; a second metal layer 170 is deposited on the substrate 110.

In the specific embodiment, preferably, the present invention forms the second metal layer 170 by sputter deposition. Preferably, the second metal layer 170 is formed by stacking the second molybdenum metal layer, the second aluminum metal layer and the third molybdenum metal layer in turn. Surely, it can be other materials such as silver (Ag), copper (Cu), chromium (Cr), tungsten (W), tantalum (Ta), titanium (Ti), nitride metal or alloy combined by any above-mentioned metal, or it can also be a multi-layer structure with a heat resistant metallic film and a low resistivity film.

Figure 2F:
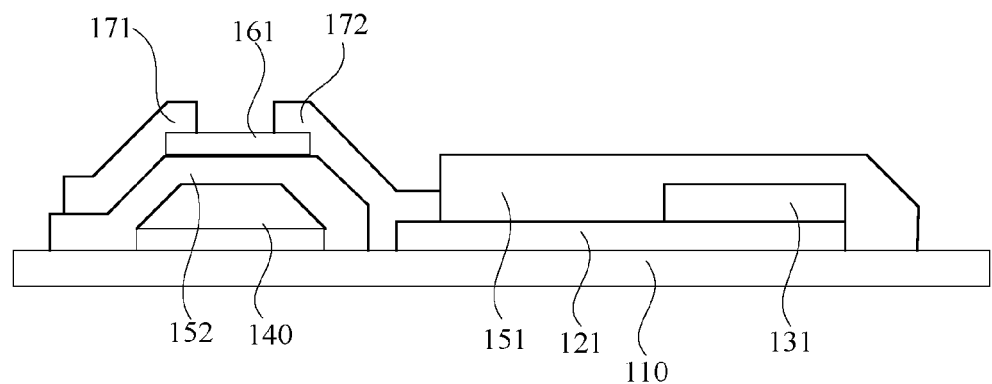

Please refer to FIG. 2F, the second metal layer 170 is patterned by a third mask and form the source 171 and the drain 172 by the second metal layer 170 on the semiconductor layer 161.

In the step of forming the source 171 and the drain 172 by the third mask, preferably, the second metal layer 170 is wet-etched by a mixture of nitric acid, phosphoric acid and acetic acid.

In one embodiment, after forming the structure as shown in FIG. 2F, a flattening layer (not shown) is deposited on the source 171, drain 172 and semiconductor layer 161 constructing the TFT to achieve the effect of flattening and device protection. Preferably, the flattening layer is formed by the transparent conductive material. Surely, it can be other materials, but the descriptions thereof are omitted herein.

Figure 2G:
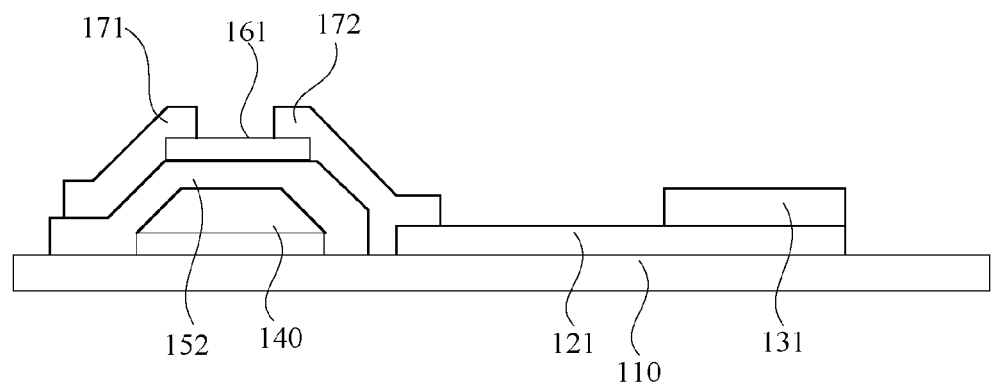
FIG. 2G is a flow schematic diagram of another preferred embodiment of the method for manufacturing the TFT array substrate in the present invention.

In another embodiment, please refer to FIG. 2G, in the step of patterning the gate insulation layer by the first mask, it can selectively remove the gate insulation layer (i.e. the gate insulation layer 151 in FIG. 2C) on the common electrode 121 and only remain the gate insulation layer 152 on the gate 140. Further, after forming the structure as shown in FIG. 2G, a flattening layer (not shown) is deposited on the common electrode 121, the reflecting layer 131, and the source 171, drain 172 and semiconductor layer 161 constructing the TFT to achieve the effect of flattening and device protection.

The present invention further provides a TFT array substrate comprising a substrate 110, and a common electrode 121 and a plurality of TFTs on the substrate 110.

The TFT comprises a gate 140, a gate insulation layer 152, a semiconductor 161, a source 171 and a drain 172. The gate 140, the gate insulation layer 152, the semiconductor layer 161, the source 171 and the drain 172 are formed in turn on the substrate 110; the gate 140 comprises a transparent conductive layer 120 and a first metal layer 130, and the source 171 and the drain 172 are formed by the second metal layer 170 on the semiconductor layer 161.

The common electrode 121 is formed by the transparent conductive layer 120 on the substrate 110. The TFT array substrate further comprises a plurality of reflecting layers 131, which are formed by the first metal layer 130 on the common electrode 121.

In the method for manufacturing the TFT array substrate and the display panel of the present invention, a MTM process is executed after depositing the transparent conductive layer and the first metal layer in turn on the substrate; this process can simultaneously form the reflecting layer when forming the gate and the common electrode, so that it merely takes four photomasks (i.e. the MTM, the first mask, the second mask and the third mask) to complete the TFT array substrate of the transflective LCD, and it needs not specifically additional mask to form the reflecting layer by photo-lithography process, so it can reduce the number of the photomasks required for the process and decrease the production cost and time.

The present invention has been described with a preferred embodiment thereof and it is understood that many changes and modifications to the described embodiment can be carried out without departing from the scope and the spirit of the invention that is intended to be limited only by the appended claims.

What is claimed is:

1. A method for manufacturing a thin-film transistor (TFT) array substrate of a transflective LCD, comprising steps of:
    providing a substrate;
    depositing a transparent conductive layer and a first metal layer in turn on the substrate, and patterning the transparent conductive layer and the first metal layer by a multi-tone mask (MTM) to form a gate, a common electrode and a reflecting layer, wherein the gate comprises the transparent conductive layer and the first metal layer; the common electrode is formed by the transparent conductive layer; the reflecting layer is formed by the first metal layer; the MTM is a gray tone mask (GTM);
    depositing a gate insulation layer on the substrate, and patterning the gate insulation layer by a first mask to remain a portion of the gate insulation layer on the gate and another portion of the gate insulation layer on the common electrode and the reflecting layer, wherein a portion of the common electrode is exposed from the another portion of the gate insulation layer;
    depositing a semiconductor layer on the substrate, and patterning the semiconductor layer by a second mask to remain the semiconductor layer on the gate; and
    depositing a second metal layer on the substrate, wherein the second metal layer is formed by stacking a second molybdenum metal layer, a second aluminum metal layer and a third molybdenum metal layer in turn; and patterning the second metal layer by a third mask to form a source and a drain including the second metal layer, wherein the drain is connected to the exposed portion of the common electrode;
    after forming the source and the drain, removing the another portion of the gate insulation layer to expose the common electrode and the reflecting layer.

2. The method for manufacturing a TFT array substrate according to claim 1, wherein after forming the source and the drain, the method further comprises the following step of:
    depositing a flattening layer on the gate insulation layer remained on the common electrode and the source, drain, and semiconductor layer constructing a TFT, wherein the flattening layer is formed by a transparent insulation material.

3. The method for manufacturing a TFT array substrate according to claim 1, wherein in the step of patterning the gate insulation layer by the first mask, the gate insulation layer on the common electrode is removed by etching.

4. The method for manufacturing a TFT array substrate according to claim 3, wherein after forming the source and the drain, the method further comprises the following step of:
    depositing a flattening layer on the common electrode, the reflecting layer on the common electrode, and the source, drain, and semiconductor layer constructing a TFT, wherein the flattening layer is formed by a transparent insulation material.

5. The method for manufacturing a TFT array substrate according to claim 1, wherein the transparent conductive layer and the first metal layer are formed by sputter deposition.

6. The method for manufacturing a TFT array substrate according to claim 1, wherein the first metal layer is formed by stacking a first aluminum metal layer and a first molybdenum metal layer in turn.

7. The method for manufacturing a TFT array substrate according to claim 1, wherein in the step of patterning the transparent conductive layer and the first metal layer by the MTM to form the gate, the common electrode and the reflecting layer, the first metal layer is wet-etched by a mixture of nitric acid, phosphoric acid and acetic acid; and the transparent conductive layer is wet-etched by oxalic acid.

8. A method for manufacturing a TFT array substrate of a transflective LCD, comprising steps of:
    providing a substrate;
    depositing a transparent conductive layer and a first metal layer in turn on the substrate, and patterning the transparent conductive layer and the first metal layer by a MTM to form a gate, a common electrode and a reflecting layer, wherein the gate comprises the transparent conductive layer and the first metal layer; the common electrode is formed by the transparent conductive layer; and the reflecting layer is formed by the first metal layer;
    depositing a gate insulation layer on the substrate, and patterning the gate insulation layer by a first mask to remain a portion of the gate insulation layer on the gate and another portion of the gate insulation layer on the common electrode and the reflecting layer, wherein a portion of the common electrode is exposed from the another portion of the gate insulation layer;
    depositing a semiconductor layer on the substrate, and patterning the semiconductor layer by a second mask to remain the semiconductor layer on the gate;
    depositing a second metal layer on the substrate, and patterning the second metal layer by a third mask to form a source and a drain including the second metal layer, wherein the drain is connected to the exposed portion of the common electrode;
    after forming the source and the drain, removing the another portion of the gate insulation layer to expose the common electrode and the reflecting layer.

9. The method for manufacturing a TFT array substrate according to claim 8, wherein after forming the source and the drain, the method further comprises the following step of:
    depositing a flattening layer on the gate insulation layer remained on the common electrode and the source, drain, and semiconductor layer constructing the TFT, wherein the flattening layer is formed by a transparent insulation material.

10. The method for manufacturing a TFT array substrate according to claim 8, wherein in the step of patterning the gate insulation layer by the first mask, the gate insulation layer on the common electrode is removed by etching.

11. The method for manufacturing a TFT array substrate according to claim 10, wherein after forming the source and the drain, the method further comprises the following step of:
    depositing a flattening layer on the common electrode, the reflecting layer on the common electrode, and the source, drain, and semiconductor layer constructing the TFT, wherein the flattening layer is formed by a transparent insulation material.

12. The method for manufacturing a TFT array substrate according to claim 8, wherein the MTM is a GTM, a stacked layer mask (SLM) or a half tone mask (HTM).

13. The method for manufacturing a TFT array substrate according to claim 8, wherein the transparent conductive layer and the first metal layer are formed by sputter deposition.

14. The method for manufacturing a TFT array substrate according to claim 8, wherein the first metal layer is formed by stacking a first aluminum metal layer and a first molybdenum metal layer in turn; and the second metal layer is formed by stacking a second molybdenum metal layer, a second aluminum metal layer and a third molybdenum metal layer in turn.

15. The method for manufacturing a TFT array substrate according to claim 8, wherein in the step of patterning the transparent conductive layer and the first metal layer by the MTM to form the gate, the common electrode and the reflecting layer, the first metal layer is wet-etched by a mixture of nitric acid, phosphoric acid and acetic acid; and the transparent conductive layer is wet-etched by oxalic acid.

* * * * *